(12) United States Patent
Zhou et al.

(10) Patent No.: US 10,416,578 B2
(45) Date of Patent: Sep. 17, 2019

(54) SUBSTRATE PRE-ALIGNMENT METHOD

(71) Applicant: SHANGHAI MICRO ELECTRONICS EQUIPMENT (GROUP) CO., LTD., Shanghai (CN)

(72) Inventors: Xiwen Zhou, Shanghai (CN); Weiwang Sun, Shanghai (CN); Cuixia Tian, Shanghai (CN); Jiaozeng Zheng, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 46 days.

(21) Appl. No.: 15/554,177

(22) PCT Filed: Feb. 26, 2016

(86) PCT No.: PCT/CN2016/074676
§ 371 (c)(1),
(2) Date: Aug. 28, 2017

(87) PCT Pub. No.: WO2016/134671
PCT Pub. Date: Sep. 1, 2016

(65) Prior Publication Data
US 2018/0046097 A1 Feb. 15, 2018

(30) Foreign Application Priority Data

Feb. 28, 2015 (CN) .......................... 2015 1 0091986

(51) Int. Cl.
G03F 9/00 (2006.01)
G03F 7/20 (2006.01)
(Continued)

(52) U.S. Cl.
CPC .............. *G03F 9/7092* (2013.01); *G03F 1/42* (2013.01); *G03F 7/20* (2013.01); *G03F 7/70733* (2013.01);
(Continued)

(58) Field of Classification Search
CPC .................................................... G03F 9/7092
(Continued)

(56) References Cited

U.S. PATENT DOCUMENTS 4,887,904 A 12/1989 Nakazato et al.
6,225,012 B1 * 5/2001 Nishi .................. G03F 7/70691
430/22

(Continued)

FOREIGN PATENT DOCUMENTS

CN 1577096 A 2/2005
CN 1659695 A 8/2005
(Continued)

*Primary Examiner* — Kara E. Geisel
*Assistant Examiner* — Omar H Nixon
(74) *Attorney, Agent, or Firm* — Muncy, Geissler, Olds & Lowe, P.C.

(57) ABSTRACT

A method for pre-aligning a substrate includes the steps of: 1) providing a substrate having a plurality of marks are arranged circumferentially on a surface thereof, wherein each of the plurality of marks consists of at least one first stripe extending in a first direction and at least one second stripe extending in a first direction; 2) aligning a center of the substrate with a given point on a substrate carrier stage; 3) illuminating a mark selected from the plurality of marks on the surface of the substrate with light and obtaining an image of the selected mark; 4) processing the image to obtain first projection data corresponding to the first direction and second projection data corresponding to the second direction; 5) identifying a set of first peak values corresponding to the at least one first stripe of the selected mark from the first projection data and a set of second peak values
(Continued)

corresponding to the at least one second stripe of the selected mark from the second projection data; 6) selecting first peak values and second peak values that a) correspond to numbers of the at least one first stripe and the at least one second stripe and b) are deemed authentic, from the set of first peak values and the set of second peak values identified in step 5) and proceeding to step 7); otherwise selecting a next mark as the selected mark and returning to step 4); 7) calculating a current position of the selected mark relative to the substrate carrier stage based on the first and second peak values selected in step 6); and 8) rotating the substrate, according to the current position of the selected mark relative to the substrate carrier stage calculated in step 7), a relative position of the selected mark on the substrate and a desired rotation angle of the substrate relative to the substrate carrier stage, until the substrate is oriented at the desired rotation angle.

8 Claims, 7 Drawing Sheets

(51) Int. Cl.
*H01L 21/027* (2006.01)
*H01L 21/68* (2006.01)
*G03F 1/42* (2012.01)
(52) U.S. Cl.
CPC .......... *G03F 9/7011* (2013.01); *H01L 21/027* (2013.01); *H01L 21/68* (2013.01); *H01L 21/681* (2013.01); *H01L 21/682* (2013.01)
(58) Field of Classification Search
USPC ......................................................... 356/401
See application file for complete search history.

(56) References Cited

U.S. PATENT DOCUMENTS

| | | | |
|---|---|---|---|
| 6,932,558 B2 | 8/2005 | Wu | |
| 2001/0016293 A1 | 8/2001 | Nishi et al. | |
| 2001/0024278 A1* | 9/2001 | Yoshida | G03F 9/7076 356/401 |
| 2001/0049589 A1 | 12/2001 | Yasuda et al. | |
| 2003/0215965 A1* | 11/2003 | Grodnensky | G03F 7/70625 438/16 |
| 2005/0219491 A1* | 10/2005 | Hayashi | G03F 7/70775 355/55 |
| 2007/0181825 A1* | 8/2007 | Yoshikawa | G03F 7/70616 250/491.1 |
| 2007/0247640 A1* | 10/2007 | Magome | G03F 9/7003 356/609 |
| 2008/0013089 A1 | 1/2008 | Ishii et al. | |
| 2008/0030715 A1* | 2/2008 | Kondo | G03F 9/7026 356/73 |
| 2009/0015836 A1* | 1/2009 | Maeda | G03F 7/706 356/400 |
| 2012/0244459 A1 | 9/2012 | Chou et al. | |
| 2013/0135458 A1 | 5/2013 | Taniguchi et al. | |
| 2013/0258339 A1* | 10/2013 | Tseng | G03F 9/7011 356/401 |
| 2015/0070679 A1* | 3/2015 | Miyazaki | G03F 9/7088 355/72 |
| 2015/0206298 A1* | 7/2015 | Miyazaki | G06K 9/00624 425/150 |

FOREIGN PATENT DOCUMENTS

| | | |
|---|---|---|
| CN | 1787200 A | 6/2006 |
| CN | 1278190 C | 10/2006 |
| CN | 101216686 A | 7/2008 |
| CN | 101436004 A | 5/2009 |
| CN | 101727011 A | 6/2010 |
| CN | 101807014 A | 8/2010 |
| CN | 101963766 A | 2/2011 |
| CN | 101981512 A | 2/2011 |
| CN | 102662308 A | 9/2012 |
| CN | 102866604 A | 1/2013 |
| CN | 103050427 A | 4/2013 |
| CN | 104111595 A | 10/2014 |
| CN | 104345574 A | 2/2015 |
| CN | 104375395 A | 2/2015 |
| EP | 1341046 A2 | 9/2003 |
| JP | H07142300 | 6/1995 |
| JP | H07288276 | 10/1995 |
| JP | 2000353655 A | 12/2000 |
| JP | 2001267216 A | 9/2001 |
| JP | 2003086483 A | 3/2003 |
| JP | 20033297743 A | 10/2003 |
| JP | 2004193425 A | 7/2004 |
| JP | 2005116626 A | 4/2005 |
| JP | 2006114919 A | 4/2006 |
| JP | 2006294993 A | 10/2006 |
| JP | 2009014919 A | 1/2009 |
| JP | 2015138806 A | 7/2015 |
| TW | 200743778 A | 12/2007 |
| TW | 200941630 A | 10/2009 |
| WO | WO2006025386 A1 | 3/2006 |
| WO | WO2013061858 A1 | 5/2013 |

\* cited by examiner

SUBSTRATE PRE-ALIGNMENT METHOD

TECHNICAL FIELD

The present invention relates to integrated circuit (IC) fabrication and, in particular, to a method for pre-alignment of a substrate.

BACKGROUND

In complex photolithographic equipment, the individual subsystems are coordinated with one another to accurately position a substrate (e.g., a silicon wafer) on an exposure stage so that a circuit pattern on a mask can be accurately exposed onto a desired location of the wafer. However, prior to this, the wafer may have undergone a large number of processes which result in considerable flaws in the wafer mainly as low roundness, an inconsistent radius and tolerances in the notch shape. Additionally, depending on the adopted TSV (Through Silicon Via) packaging processes, the resulting wafers may have various geometric issues such as adhesive bumps and edge burrs. Therefore, the complexity of wafer edge geometry places a great challenge on wafer pre-alignment. Whether the wafer can be placed on the exposure stage within a given deviation range will have a directly impact on the performance of the photolithographic equipment. Thus, wafer pre-alignment plays a vital role and affects the wafer placement accuracy.

Wafer centering is a process to adjust the position of a wafer relative to that of a wafer stage so as to align a center of the wafer with a predetermined position (e.g., a center) of the stage, while wafer orientation is a process to accurately determine the positions of notches or marks on the centered wafer and, based thereon, rotate the wafer so that it is oriented at a given angle with respect to the wafer stage. The existing wafer pre-alignment methods involve identifying the notches at the edge of the wafer by means of image capture devices. However, the identification requires binarization of the captured images, which imposes critical requirements on the clarity of the images, making the methods not universal.

SUMMARY OF THE INVENTION

In order to overcome the above-described problems, the present invention provides a method for pre-aligning a substrate, including the steps of: 1) providing a substrate having a plurality of marks arranged circumferentially on a surface thereof, wherein each of the plurality of marks consists of at least one first stripe extending in a first direction and at least one second stripe extending in a second direction; 2) aligning a center of the substrate with a given point on a substrate carrier stage; 3) illuminating a mark selected from the plurality of marks on the surface of the substrate with light and obtaining an image of the selected mark; 4) processing the image to obtain first projection data corresponding to the first direction and second projection data corresponding to the second direction; 5) identifying a set of first peak values corresponding to the at least one first stripe of the selected mark from the first projection data and identifying a set of second peak values corresponding to the at least one second stripe of the selected mark from the second projection data; 6) selecting first peak values and second peak values that a) correspond to numbers of the at least one first stripe and the at least one second stripe and b) are deemed authentic, from the set of first peak values and the set of second peak values identified in step 5) and proceeding to step 7); otherwise selecting a next mark as the selected mark and returning to step 4); 7) calculating a current position of the selected mark relative to the substrate carrier stage based on the first and second peak values selected in step 6); and 8) rotating the substrate, according to the current position of the selected mark relative to the substrate carrier stage calculated in step 7), a relative position of the selected mark on the substrate and a desired rotation angle of the substrate relative to the substrate carrier stage, until the substrate is oriented at the desired rotation angle.

Further, calculating a current position of the selected mark relative to the substrate carrier stage in step 7) may include: acquiring a first center coordinate of the set of first peak values along the first direction and a second center coordinate of the set of second peak values along the second direction and obtaining a transition coordinate for the selected mark from the first center coordinate and the second center coordinate; and calculating a current coordinate of the selected mark relative to the substrate carrier stage based on the transition coordinate by using a coordinate rotation method.

Further, in step 4), the first projection data and the second projection data may be obtained by performing linear integration on the image respectively along the first and second directions.

Further, in step 4), the set of first peak values and the set of second peak values may be identified by performing cluster analysis on the first projection data and the second projection data, respectively.

Further, each of the plurality of marks may consist of at least two first stripes extending in the first direction and at least two second stripes extending in the second direction, and wherein step 6) may include: calculating a coordinate interval between each pair of peak values in the set of first peak values and if the coordinate interval matches with a distance between each pair of first stripes in the selected mark, the pair of peak values are deemed authentic.

Further, if the first or second peak values that are deemed authentic do not correspond to the number of the corresponding first or second stripes, step 6) may further include: for each of the first or second peak values that are deemed authentic, determining corresponding distances from neighbors in the first or second direction to obtain a degree of centrality in the first or second direction; and selecting the first and second peak values that correspond to the number of the corresponding first or second stripes based on the degree of centrality.

Further, the first direction and the second direction may be perpendicular to each other or may have a certain angle.

Further, in step 3), the surface of the substrate may be perpendicularly illuminated by the light and the image of the selected mark may be formed by the light perpendicularly reflected from the surface of the substrate.

Further, the method may further include, after step 7): assessing whether the current coordinate of the selected mark relative to the substrate carrier stage is reliable according to a neighbor coherence principle, and if reliable, proceeding to step 8); otherwise selecting the next mark as the selected mark and returning to step 4).

The present invention offers the following advantages over the prior art:

1. Use of the Radon conversion algorithm allows identification of a mark stripe extending in a given direction by projecting its image along the direction. This circumvents placing high requirements on image clarity and enhances the robustness of the substrate orientation algorithm Additionally, the Radon conversion is capable of low-frequency filtering and is hence more accurate than the Hough conversion.

2. Identifying the marks instead of the edge notch avoids image binarization and further improves the universality and noise immunity of the substrate orientation algorithm. In addition, although a plurality of marks are formed in the substrate, according to the present invention, its pre-alignment can be accomplished by measuring only one or two of the marks, with the remaining marks serving as spares in the case of the selected mark being unidentifiable.

3. The farthest neighbor distance algorithm can mitigate the influence of strong interferers on the wafer surface such as etched circuit traces, TSVs and scribed grooves and improves the process adaptability of the pre-alignment and orientation method.

4. The neighbor coherence algorithm entails a more reliable approach for verifying a plausible mark, which completely solves the problem of false mark detection during the orientation and avoids the lack of universality arising out of the use of an artificial threshold. Thus, the reliability and capability of discrimination against false detection of similar signals are increased.

5. Use of the cluster analysis entails a more powerful approach to find more reliable peak values, with less possibility of damage detection and miss detection.

DETAILED DESCRIPTION

In order for the above objectives, features and advantages of the present invention to be more apparent and readily understood, a few specific embodiments of the present invention will be described in detail below with reference to the accompanying drawings. It is noted that the drawings are provided in a very simplified form not necessarily presented to scale, with the only purpose of facilitating convenience and clarity in explaining the embodiments.

Figure 1:
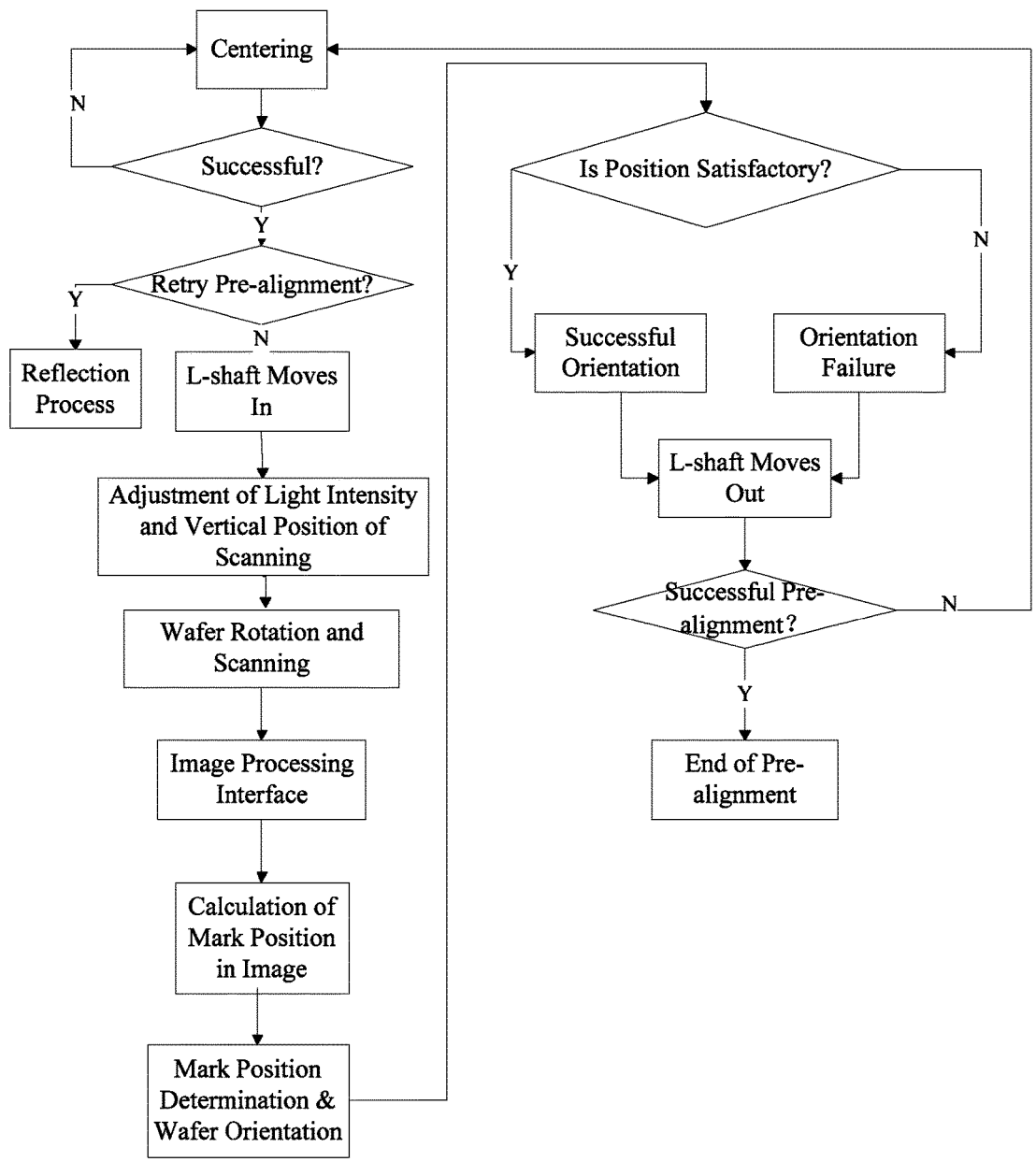
FIG. 1 is a flowchart graphically illustrating a substrate pre-alignment method in accordance with a specific embodiment of the present invention.

As shown in FIG. 1, a method for pre-aligning a substrate proposed in the present invention is applicable to various substrates such as silicon wafers and glass substrates. While the following description is made in the context of a silicon wafer, the present invention is not limited thereto. The method includes the steps set forth below.

Figure 2A:
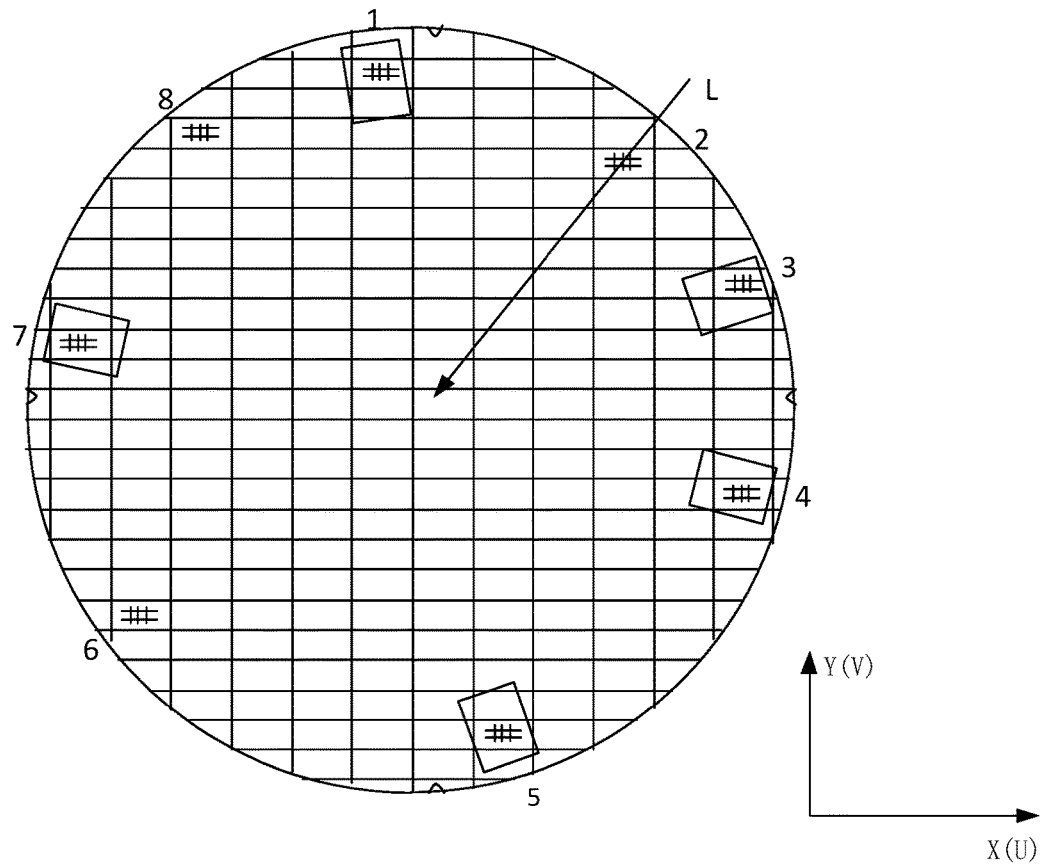
FIG. 2a schematically illustrates a substrate and marks thereon in accordance with a specific embodiment of the present invention, wherein an L-shaft is located above a No. 2 mark.
Figure 2B:
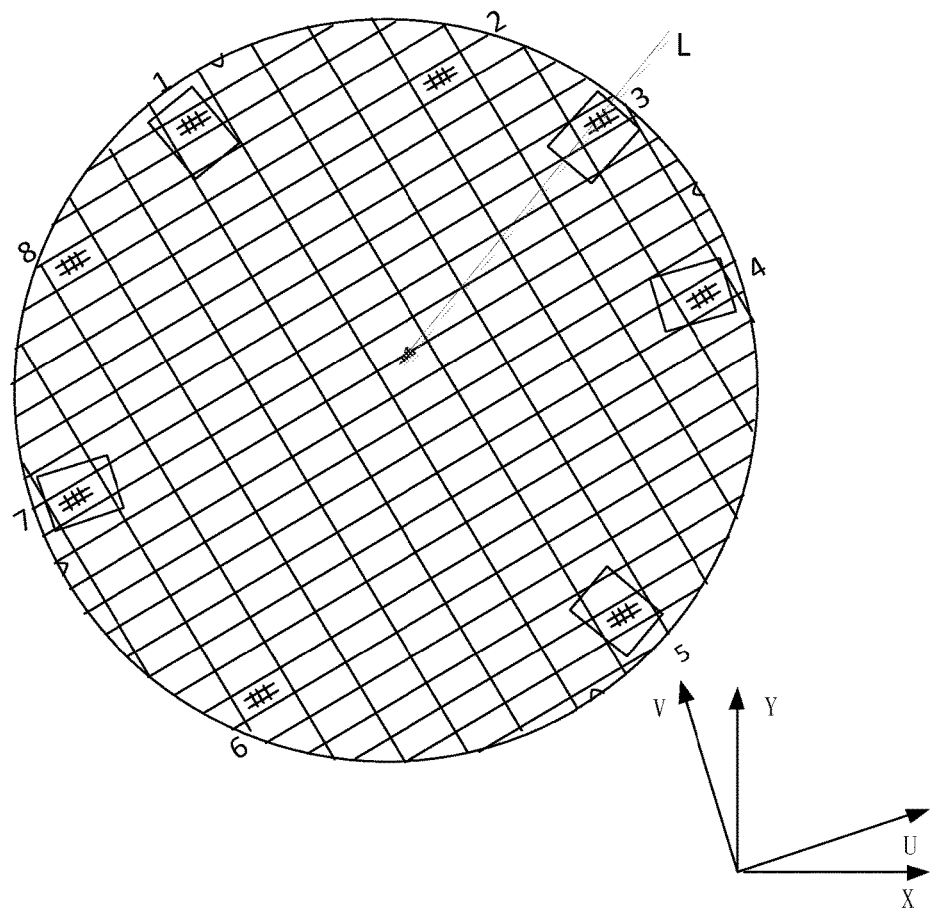
FIG. 2b schematically illustrates a substrate and marks thereon in accordance with a specific embodiment of the present invention, wherein an L-shaft is located above a No. 3 mark.
Figure 3A:
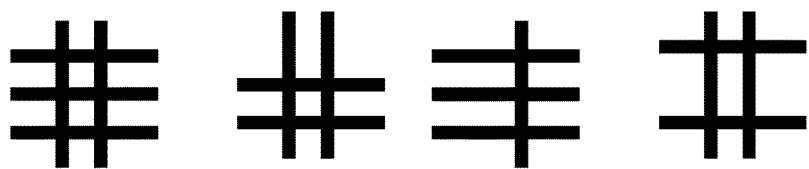
FIGS. 3a to 3c schematically illustrate marks with different angles and different forms in accordance with specific embodiments of the present invention.
Figure 3B:
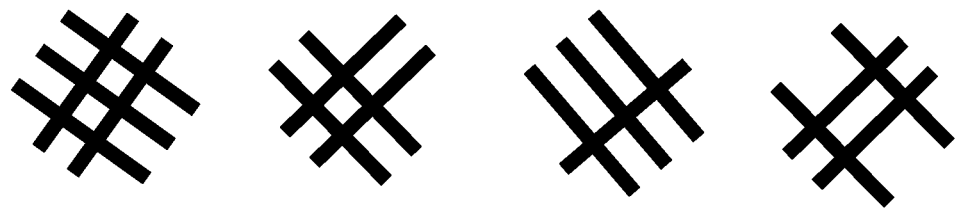
Figure 3C:
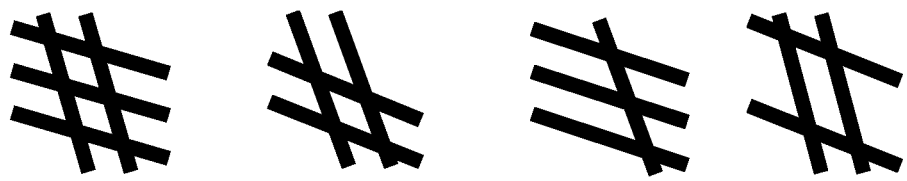

In Step 1, a silicon wafer is provided, on which a number of marks are circumferentially arranged. The arrangement of the marks may be determined based on the practical application in which the wafer is used, as well as on the requirements of subsequent processes. Wafers of the same lot may bear the same number of marks arranged in the same manner. As shown in FIGS. 2a and 2b, since the marks are not formed in the edge portions of the wafer which portions are usually associated with relatively great noises, the influences of the earlier processes on the marks are smaller than those on the notch, which is formed in the wafer edge. Therefore, for the earlier processes, the marks are relatively reliable and adaptable. Further, as shown in FIG. 3a, the marks may be a variety of stripe-type marks each consisting of at least one stripe extending along a first direction and at least one stripe extending along a second direction. The stripes of the two directions may either cross each other perpendicularly (as shown in FIGS. 3a and 3b) or at a certain angle (as shown in FIG. 3c). Therefore, the marks may be categorized into perpendicular stripes marks and non-perpendicular stripes marks.

It is to be noted that, during the initial use of the marks, updates are necessary to be made based on their coordinates on the wafer, the angle between the stripes and other specifications. Specifically, the coordinates of the numbered marks on the wafer are collected. The coordinates of the marks may be factory parameters of the wafer and may be Cartesian or polar ones. Wafer of the same lot may have the same mark coordinates. Afterward, the angle between the two directions in which the stripes of every mark extend is gathered by an equipment. Lastly, parameters of the equipment are updated based on the specifications of the marks (e.g., their stripe width, strip pitches and size of the marks). The marks may be numbered based on their positions on the wafer (while the marks are shown in FIGS. 2a and 2b as being numbered in the clockwise direction as 1, 2, 3 . . . 8, the marks may be also numbered in a different order).

The prerecorded coordinates of the marks may correspond to their numbering and may, together with their actual coordinates measured in a subsequent process, serve as a basis for rotating and thereby accurately orienting the wafer. This will be described in detail below.

Here, it is to be noted that the coordinates of the marks are represented by the coordinates of their centers, and it is a matter of course that the coordinates may also be represented in other ways well-known in the art. The description of the following embodiments is made in the context where the coordinates of the marks are measured as their center coordinates and, for the purpose of measurement, the stripes in each of the marks are such that the stripes extending in the first direction have a central line passing through the center of the mark and the stripes extending in the second direction also have a central line passing through the center of the mark.

However, when the coordinates of the marks are defined in another manner, for example, when they are not represented by their center coordinates, the design of the marks may be accordingly modified. In this case, the stripes in the marks may not have their central lines pass through the center of the mark.

In step 2, the wafer is centered. In other words, the center of the wafer is aligned with a given point on a wafer stage (e.g., the center of the wafer stage). This step may be carried out by a centering stage in a conventional manner and will not be described here in further detail for the sake of simplicity.

In step 3, a sight switching shaft of a wafer pre-alignment apparatus is moved radially with respect to the wafer such that each of the marks on the wafer can be made located within a projection imaging field of an image capture device disposed on the sight switching shaft. Specifically, as shown in FIG. 2a, the sight switching shaft (referred hereinafter as the "L-shaft") may extend from the edge of the wafer toward the center of the wafer. Preferably, the centers of the marks on the wafer may be located on the same circle centered at the center of the wafer. In this way, it is possible to make each mark be located within the projection imaging field of the image capture device simply by rotating the wafer instead of by moving the L-shaft and the image capture device.

In step 4, with the surface of the wafer being illuminated by light propagating perpendicular thereto, the wafer is rotated intermittently so that in each cycle one or more of the marks are located under the L-shaft, scanned and identified in order to determine their actual coordinates. Specifically, the light illuminating the wafer may be emitted from a light source arranged on the sight switching shaft. The illumination direction may be perpendicular to the surface of the wafer. A reflective element may be provided under the wafer so that the light from the light source that has passed through the mark is reflected onto the image capture device where it forms an image of the mark.

FIG. 2a schematically illustrates the scanning of a No. 2 mark located under the L-shaft. In the illustrated configuration, the directions U, V in which the stripes in the mark respectively extend are exactly in line with the X and Y axes of a coordinate system of the wafer stage. FIG. 2b schematically illustrates the scanning of a No. 3 mark located under the L-shaft. In the illustrated configuration, the directions U, V in which the stripes in the mark respectively extend are oblique with respect to the X and Y axes of the coordinate system of the wafer stage.

Determining the coordinates of the marks may specifically include the following steps.

Figure 4:
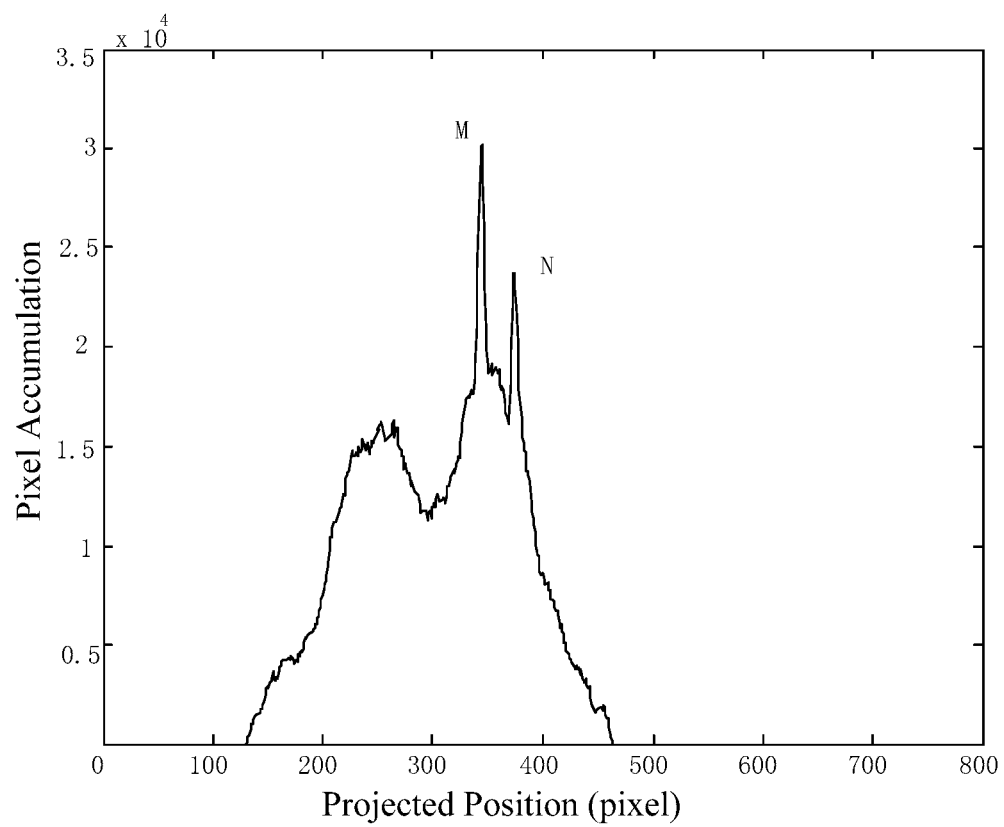
FIGS. 4 and 5 are diagrams showing curves plotted from the results of linear integration performed on projection data in accordance with a specific embodiment of the present invention.
Figure 5:
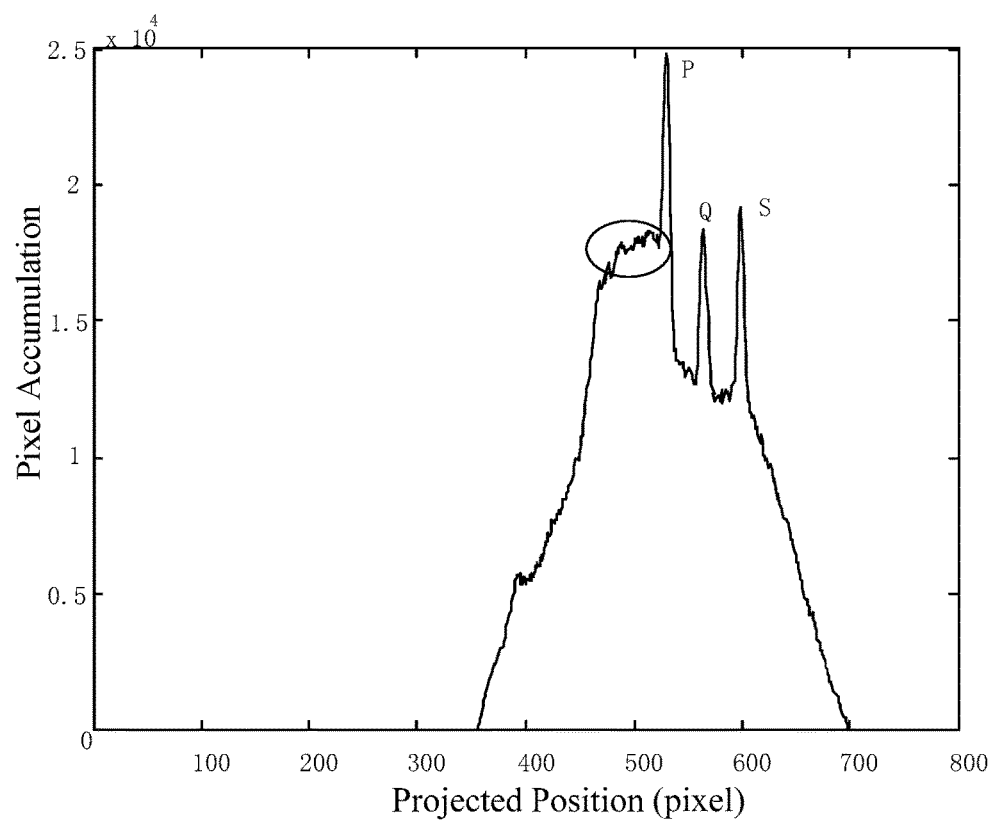

In step 41: the image of the mark is projected along the directions in which the strips in the mark extend to obtain the respective projection data. That is, a radon conversion is performed on the stripes in the image of the mark. In other words, the image of the stripes in the mark is linearly integrated respectively along the U and V directions. The results of the linear integration are plotted and as shown in FIGS. 4 and 5. It will be readily understood by those skilled in the art that the stripes will appear as several peaks in the plotted curves.

In step 42, a number of peak values are picked up from the projection data resulting from step 41 and the coordinates of the peak values along the projection directions are obtained. Specifically, a cluster analysis may be carried out on the projection data to select values therefrom with the greatest degrees of centrality among neighbors (which can be described by the kurtosis in data analysis). For example, the peaks M, N, P, Q and S in FIGS. 4 and 5 are selected as those with the greatest degrees of centrality among neighbors, which are not necessarily the highest ones. In other words, a "hill" in a "basin" is preferred over a "mound" on a "plateau". For example, the peak Q in FIG. 5 has an accumulated pixel value that is actually close in magnitude to the accumulated pixel values of the several peaks left to P (i.e., those encircled in the figure). However, as these encircled peaks each having a great accumulated pixel value are clustered together and appear like a "plateau", even though one of them may be higher than the others (i.e., a "mound" on the "plateau"), it is not desired by us. In contrast, the peak Q is chosen because the data points around the peak Q are obviously lower than it, making the peak Q look like a "hill" erected in a "basin".

In theory, the number of selected peaks for a certain projection direction should be equal to the number of stripes extending in this direction. However, in step 42, it may happen that the number of selected peaks is greater than the number of strips possibly due to one or more wrongly chosen peaks. For this reason, the selected peaks are verified in one or more of steps 43-45 described below.

In step 43, from the peak values selected in step 42, those defining a coordinate interval that matches with the stripe interval of the mark (known from the initially obtained mark data) are extracted. That is, the peak values are divided into two groups: acceptable and unacceptable, depending on how the distance between the peak values is matched with the distance between the stripes of the mark so that their authenticity levels are determined. In the acceptable group, the difference between a distance between two peak values and a distance between the mark stripes lies within a tolerable error range. Here, the error refers to a mechanical error of the image capture device. Whereas, in the unacceptable group, the difference between a distance between two peak values and a distance between the mark stripes is relatively great. Step 43 enables selection of desired peak value coordinates.

In order to further improve the measurement accuracy, step 43 may also be combined with the following steps 44-45.

In step 44, vertical distances of each peak value resulting from step 43 from neighbors and hence its degree of vertical centrality are determined.

Then horizontal distances of the peak value from its neighbors and hence its degree of horizontal centrality are determined.

In step 45, based on the results of steps 43-44, several peak values with the greatest similarity are identified as premium peak values. Specifically, the authenticity levels determined in step 43 may be multiplied by the respective horizontal and vertical degrees of centrality determined in step 44, and the maximum is taken as the greatest similarity degree. Those closest to the one with the greatest similarity degree are taken as the peak values with the greatest similarity.

In step 46, if the numbers of premium peak values for the U and V directions are equal to the respective numbers of stripes extending in the U and V directions, horizontal and vertical coordinates of the center of the mark are calculated. Specifically, the center coordinates of the premium peak values for the U and V directions are calculated respectively, such that the center coordinate of the premium peak values for the U direction is the horizontal (or vertical) coordinate of the center of the mark and the center coordinate of the premium peak values for the V direction is the vertical (or horizontal) coordinate of the center of the mark.

In the case of FIG. 2a, as the U and V directions are just in coincidence with the X and Y directions, respectively, the horizontal and vertical coordinates of the center of the mark obtained above are directly taken as the desired actual coordinate of the mark without being subjected to coordinate conversion. In the case of FIG. 2b, as the U and V directions are slanted at an angle with respect to the X and Y directions, respectively, a coordinate rotation is required to obtain the actual coordinate of the center of the mark in the wafer stage coordinate system (the X-Y coordinate system).

Figure 6:
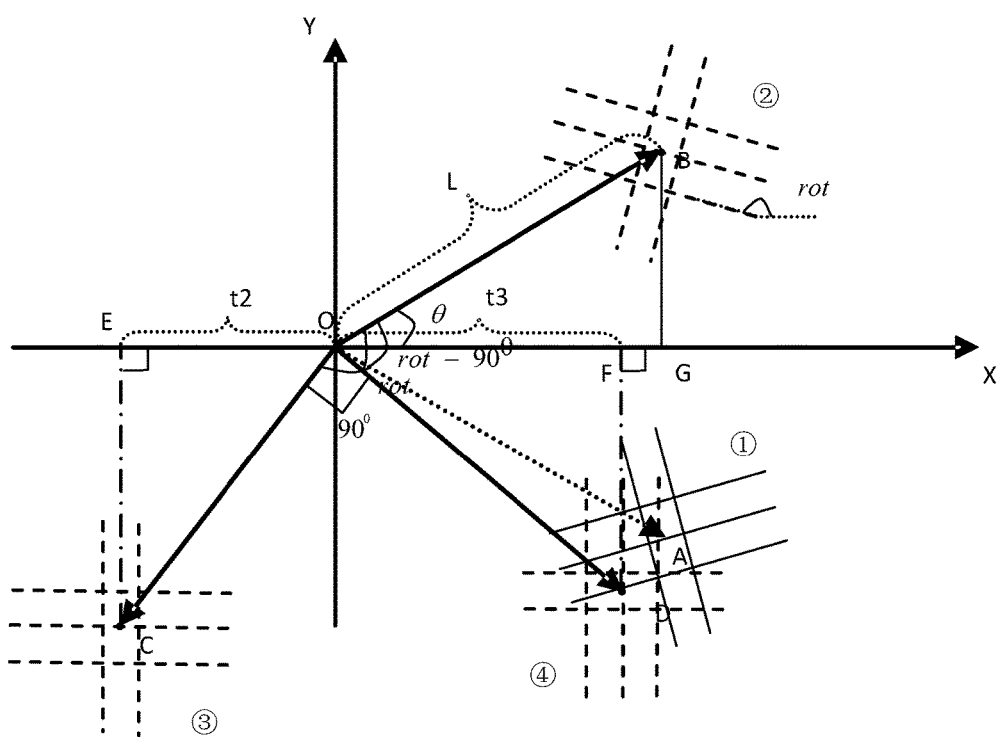
FIGS. 6 and 7 schematically illustrate coordinate rotation in accordance with specific embodiments of the present invention.
Figure 7:
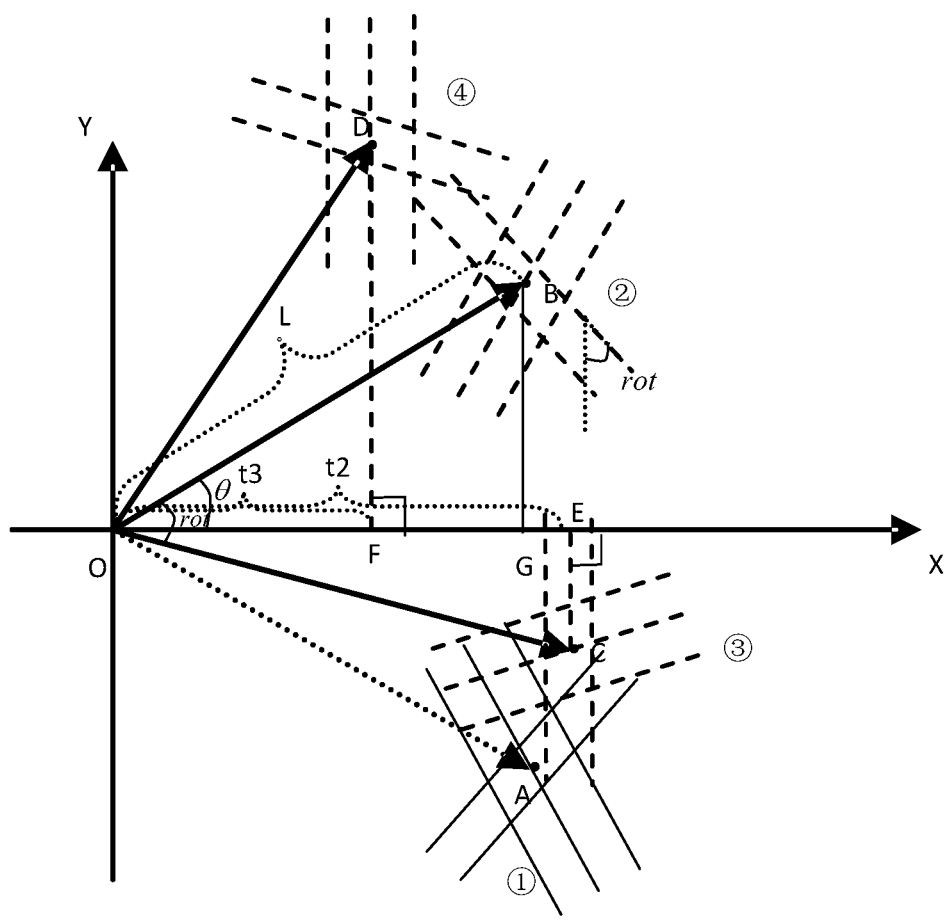

In particular, when the U and V directions are not in coincidence with the X and Y directions, the center coordinate (in the X-Y coordinate system) of the mark may be obtained using a coordinate rotation method. Specifically, as shown in FIGS. 6 and 7, points A-D represent the center of a mark in different positions, and points E, F and G are projections of the point C, D and B, respectively. At first, a mark ① (which could be any one of the eight marks shown in FIG. 2) is mirrored into a mark ② with respect to the X-axis. As an initial deflection angle rot (an angle between the direction of given stripe(s) and the horizontal X or vertical Y direction at the time when the image of the mark is captured) of the mark ① can be calculated based on the coordinates of the mark on the wafer, the mark ② is then rotated by the angle rot into a mark ③, wherein in the mark ③, the direction in which the given stripe(s) extends is parallel or perpendicular to the coordinate axes (some of the stripes in the mark ③ shown in FIG. 7 are perpendicular to the X-axis). Further, a projection value t2 of the center of the mark ③ on the X-axis is obtained. After that, the mark ③ is rotated by 90 degrees into a mark ④ (it is a matter of course that distortion of the mark may also be taken into account—if the mark does not have any distortion, then it is rotated by 90 degrees; otherwise, it is rotated by an angle determined based on its distortion), and a projection value t3 of the center of the mark ④ on the X-axis is determined, based on which, the distance from the center of the mark ① to the origin O of the coordinate system (which is equal to the distance L from the center of the mark ② to the origin O) as well as an angle between the straight line AO and the X-axis (which is equal to the angle θ between the straight line BO and the X-axis) are determinable according to the congruent triangle principles, and thereby obtaining the center coordinates of the peak values.

In step 47: the coordinates obtained in step 46 are geometrically rotated using the above-describe method into the coordinates prior to the projection, i.e., the actual coordinates of the mark in the wafer stage coordinate system (X-Y coordinate system).

In step 48: the reliability of the coordinates obtained in step 47 is assessed according to a neighbor coherence principle so as to preclude any false coordinates. The neighbor coherence principle is such that, based on the stability of the mark signal, during the scanning by the search window upward, downward, to the left or right, an equally strong mark signal will certainly be detected in at least one of these directions, which will not happen for a fake mark. In this way, the possibility of occasionally identifying a fake mark as a real mark will be precluded.

In step 49: the reliable data from step 48, i.e., the center coordinate of the mark, is returned.

In step 5, based on the correctly identified center coordinate of the mark, the wafer is rotated and oriented, followed by withdrawal of the sight switching shaft radially with respect to the wafer. Specifically, with the eight marks of FIG. 2 as an example, in step 5, the orientation would be accomplishable even if the correctly identified center coordinate of only one mark has been returned. However, as any mark on the wafer is possibly a damaged one, it is desirable that more than one mark is handled so that even if a selected mark is unidentifiable, the process could automatically switch to another mark. Finally, the mark is geometrically rotated back to the original coordinate system, and its coordinate on the wafer is obtained based on the position of its image with respect to the wafer.

Preferably, as shown in FIG. 2a, since the marks are formed in the wafer so that they are oriented along the same direction, before an image (schematically represented by the boxes in the figure) of a mark is captured by the image capture device, it is necessary to inform the algorithm of which mark has been selected to be handled by providing the coordinate of the mark to the algorithm, based on which, the wafer will be rotated to allow the mark to roughly approach the position where it is suitable to be imaged so as to facilitate its search and positioning.

In case a linear CCD array is used, the captured image will be obtained by vertically putting together the images of scanned arc areas. Depending on the angle of the arcs, the obtained image may have a certain degree of distortion, making two stripes of the mark that are perpendicular to each other appear in the image as not crossing each other at right angles. In this case, the determination of the angle between the stripes of the mark will also take into account the scanned angle of the linear CCD array. Therefore, when a linear CCD array is used as the image capture device, in order to facilitate the processing by the algorithm, it is desired to set a fixed scanned angle beforehand so that the captured images will have the same degree of distortion. Alternatively, a two-dimensional CCD array may also be used as the image capture device for imaging and positioning of the mark.

Furthermore, in order to enhance the process adaptability of the pre-alignment and orientation method according to the present invention, a farthest neighbor distance algorithm is employed to reduce the influence of some strong interferers on the wafer surface such as etched circuit traces, TSVs and scribed grooves. Specifically, for each peak value, the sum of absolute values of its differences from the five preceding neighbors and five succeeding neighbors may serve as a criterion. In addition, in this embodiment, a threshold may be defined as the multiplication of the difference between two peak values most different in color and the stripe length in order to indicate the contrast of the mark against the image. In this way, images captured with the image capture device being seriously defocused or blurred images can be identified and discarded.

The present invention provides the following advantages over the prior art:

1. Use of the Radon conversion algorithm allows identification of a mark stripe extending in a given direction by projecting its image along the direction. This circumvents placing high requirements on image clarity and enhances the robustness of the substrate orientation algorithm Additionally, the Radon conversion is capable of low-frequency filtering and is hence more accurate than the Hough conversion.

2. Identifying the marks instead of the edge notch avoids image binarization and further improves the universality and noise immunity of the substrate orientation algorithm. In addition, although a plurality of marks are formed in the substrate, according to the present invention, its pre-alignment can be accomplished by measuring only one or two of the marks, with the remaining marks serving as spares in the case of the selected mark being unidentifiable.

3. The farthest neighbor distance algorithm can mitigate the influence of strong interferers on the wafer surface such as etched circuit traces, TSVs and scribed grooves and improves the process adaptability of the pre-alignment and orientation method.

4. The neighbor coherence algorithm entails a more reliable approach for verifying a plausible mark, which completely solves the problem of false mark detection during the orientation and avoids the lack of universality arising out of the use of an artificial threshold. Thus, the reliability and capability of discrimination against false detection of similar signals are increased.

5. Use of the cluster analysis entails a more powerful approach to find more reliable peak values, with less possibility of damage detection and miss detection.

It is apparent that those skilled in the art can make various changes and modifications without departing from the spirit and scope of the invention. Accordingly, it is intended that the present invention also embraces such changes and modifications if they fall within the scope of the appended claims and the equivalents thereof.

What is claimed is:

1. A method for pre-aligning a substrate, comprising the steps of:
1) providing a substrate having a plurality of marks arranged circumferentially on a surface thereof, wherein each of the plurality of marks consists of at least two first stripes extending in a first direction and at least one second stripe extending in a second direction;
2) aligning a center of the substrate with a given point on a substrate carrier stage;
3) illuminating a mark selected from the plurality of marks on the surface of the substrate with light and obtaining an image of the selected mark;
4) processing the image to obtain first projection data corresponding to the first direction and second projection data corresponding to the second direction;
5) identifying a set of first peak values corresponding to the at least two first stripes of the selected mark from the first projection data and identifying a set of second peak values corresponding to the at least one second stripe of the selected mark from the second projection data;
6) selecting first peak values and second peak values that a) correspond to numbers of the at least two first stripes and the at least one second stripe and b) are deemed authentic, from the set of first peak values and the set of second peak values identified in step 5) and proceeding to step 7); otherwise selecting a next mark as the selected mark, obtaining an image of the selected mark and returning to step 4);
7) calculating a current position of the selected mark relative to the substrate carrier stage based on the first and second peak values selected in step 6); and
8) rotating the substrate, according to the current position of the selected mark relative to the substrate carrier stage calculated in step 7), a relative position of the selected mark on the substrate and a desired rotation angle of the substrate relative to the substrate carrier stage, until the substrate is oriented at the desired rotation angle,
wherein step 6) comprises:
calculating a coordinate interval between each pair of peak values in the set of first peak values and if the coordinate interval matches with a distance between each pair of first stripes in the selected mark, the pair of peak values are deemed authentic.

2. The method for pre-aligning a substrate according to claim 1, wherein calculating a current position of the selected mark relative to the substrate carrier stage in step 7) comprises:
acquiring a first center coordinate of the set of first peak values along the first direction and a second center coordinate of the set of second peak values along the second direction and obtaining a transition coordinate for the selected mark from the first center coordinate and the second center coordinate; and
calculating a current coordinate of the selected mark relative to the substrate carrier stage based on the transition coordinate by using a coordinate rotation method.

3. The method for pre-aligning a substrate according to claim 2, further comprising, after step 7):
assessing whether the current coordinate of the selected mark relative to the substrate carrier stage is reliable according to a neighbor coherence principle, and if reliable, proceeding to step 8); otherwise selecting the next mark as the selected mark, obtaining an image of the selected mark and returning to step 4).

4. The method for pre-aligning a substrate according to claim 1, wherein in step 4), the first projection data and the second projection data are obtained by performing linear integration on the image respectively along the first and second directions.

5. The method for pre-aligning a substrate according to claim 1, wherein in step 4), the set of first peak values and the set of second peak values are identified by performing cluster analysis on the first projection data and the second projection data, respectively.

6. The method for pre-aligning a substrate according to claim 1, wherein if the first or second peak values that are deemed authentic do not correspond to the number of the corresponding first or second stripes, step 6) further comprises:
for each of the first or second peak values that are deemed authentic, determining corresponding distances from neighbors in the first or second direction to obtain a degree of centrality in the first or second direction; and
selecting the first and second peak values that correspond to the number of the corresponding first or second stripes based on the degree of centrality.

7. The method for pre-aligning a substrate according to claim 1, wherein the first direction and the second direction are perpendicular to each other or have a certain angle.

8. The method for pre-aligning a substrate according to claim 1, wherein in step 3), the surface of the substrate is perpendicularly illuminated by the light, and the image of the selected mark is formed by the light perpendicularly reflected from the surface of the substrate.

* * * * *